United States Patent
Verbruggen

(10) Patent No.: US 8,618,973 B2
(45) Date of Patent: Dec. 31, 2013

(54) INTERLEAVED PIPELINED BINARY SEARCH A/D CONVERTER

(75) Inventor: Bob Verbruggen, Kessel-Lo (BE)

(73) Assignees: IMEC, Leuven (BE); Vrije Universiteit Brussel, Brussels (BE)

( * ) Notice: Subject to any disclaimer, the term of this patent is extended or adjusted under 35 U.S.C. 154(b) by 140 days.

(21) Appl. No.: 13/382,735

(22) PCT Filed: Jul. 8, 2010

(86) PCT No.: PCT/EP2010/059821
§ 371 (c)(1),
(2), (4) Date: Feb. 2, 2012

(87) PCT Pub. No.: WO2011/003978
PCT Pub. Date: Jan. 13, 2011

(65) Prior Publication Data
US 2012/0133535 A1    May 31, 2012

Related U.S. Application Data

(60) Provisional application No. 61/224,519, filed on Jul. 10, 2009.

(30) Foreign Application Priority Data

Jan. 26, 2010   (EP) ..................................... 10151660

(51) Int. Cl.
*H03M 1/44*   (2006.01)
*H03M 1/14*   (2006.01)

(52) U.S. Cl.
USPC .......................................... 341/162; 341/156

(58) Field of Classification Search
USPC ........................ 341/156, 158, 161, 162, 163
See application file for complete search history.

(56) References Cited

U.S. PATENT DOCUMENTS 5,579,006 A * 11/1996 Hasegawa et al. ............ 341/162
6,169,502 B1    1/2001 Johnson
(Continued)

FOREIGN PATENT DOCUMENTS

EP    1679799    7/2006

OTHER PUBLICATIONS

PCT Written Opinion, PCT International Application No. PCT/EP2010/059821 dated Jun. 28, 2011.
(Continued)

*Primary Examiner* — Howard Williams
(74) *Attorney, Agent, or Firm* — McDonnell Boehnen Hulbert & Berghoff LLP

(57) ABSTRACT

The present invention is related to a pipelined analog-to-digital converter, ADC, for converting an analog input signal into a digital signal comprising—a plurality of comparing means having tuneable thresholds for comparing an input signal with; at least two of said given thresholds being different and—a plurality of amplifying circuits,—wherein said plurality of comparing means is configured to form a hierarchical tree structure, said hierarchical tree structure having a plurality of hierarchical levels, wherein at least one of said hierarchical levels is associated with at least one amplifying circuit of said plurality of amplifying circuits, said at least one amplifying circuit generating the input of at least one comparing means at the next hierarchical level and—wherein said plurality of hierarchical levels comprises means for setting said tuneable thresholds in accordance to the output of previous hierarchical level so that non-linear distortion of the preceding hierarchical level is removed.

21 Claims, 8 Drawing Sheets

(56) References Cited

U.S. PATENT DOCUMENTS

| | | |
|---|---|---|
| 2003/0132867 A1 | 7/2003 | Ostom et al. |
| 2005/0062635 A1 | 3/2005 | Franz |
| 2006/0066466 A1* | 3/2006 | Pan et al. ............... 341/161 |
| 2006/0119500 A1* | 6/2006 | Serrano et al. .......... 341/155 |
| 2006/0158362 A1* | 7/2006 | Shimizu et al. .......... 341/144 |
| 2009/0303093 A1* | 12/2009 | Gribok et al. ........... 341/141 |

OTHER PUBLICATIONS

European Partial Search Report, European Patent Application No. 10151660.7 dated Jul. 9, 2010.

European Search Report, European Patent Application No. 10151660.7 dated Nov. 10, 2010.

International Search Report, PCT International Application PCT/EP2010/059821 dated Jun. 28, 2011.

* cited by examiner

INTERLEAVED PIPELINED BINARY SEARCH A/D CONVERTER

CROSS-REFERENCE TO RELATED APPLICATIONS

The present application is a U.S. national stage application of International Patent Application No. PCT/EP2010/059821 filed Jul. 8, 2010, which claims priority to European Patent Application No. 10151660.7 filed Jan. 26, 2010 and U.S. Provisional Application 61/224,519 filed Jul. 10, 2009.

FIELD OF THE INVENTION

The present invention generally relates to an analog-to-digital converter wherein a binary search is used.

BACKGROUND OF THE INVENTION

Some applications, such as hard disk read channels or wideband wireless standards, require a low-resolution (for example, approximately 6 bit), high-speed (for example, greater than 1 Giga-samples per second (GS/s)) analog-to-digital converter (ADC).

Traditionally there are two architectures for low-resolution high-speed ADCs: time-interleaved Successive Approximation Register (SAR) converters and flash converters. Single-channel SAR converters typically operate at sampling frequencies of a few hundred megasamples per second (MS/s) (for example, approximately 300 MS/s). As a result, a large number of channels would need to be interleaved, yielding a large input capacitance. Depending on the chosen approach, a time-interleaved SAR architecture for the same specifications could have an input capacitance 10-20 times larger than a pipelined binary search ADC. Flash converters on the other hand would be severely limited by quantized power, as for each conversion 63 comparisons (6 bit) would have to be made at low noise/offset. The power requirement for similar specifications with a calibrated flash converter would be 10 times larger than the power consumption in a pipelined binary search ADC.

Pipelined analog-to-digital converters have become popular for sampling rates from a few megasamples per second up to 100 megasamples per second. Dynamic pipelined conversion enables low power quantization at high speed with low input capacitance but requires calibration.

US patent application US2005/0062635 introduces a pipelined analog-to-digital converter that follows a non-linear scale and allows operation at frequencies of 2 GHz and more. The pipelined ADC comprises a number of comparator stages where the thresholds of the comparator stages are adjusted in accordance with the digital conversion results from the previous stage. To summarize, an architecture and method are proposed in this document to provide a pipelined ADC with a programmable characteristic so even a non-linear scale may be implemented. The output signals are processed via linear signal processing, using linear amplifiers.

AIMS OF THE INVENTION

The present invention aims to provide for an analog-to-digital converter with reduced power consumption (low-resolution, high-speed).

SUMMARY

A pipelined analog-to-digital converter for converting an analog input signal into a digital signal is presented. The pipelined analog-to-digital converter comprises a plurality of comparing means having tuneable thresholds for comparing an input signal with, whereby at least two of said given thresholds are different, and a plurality of amplifying circuits. The plurality of comparing means is configured to form a hierarchical tree structure, having a plurality of hierarchical levels. At least one of the hierarchical levels is associated with at least one amplifying circuit of the plurality of amplifying circuits. The at least one amplifying circuit generates the input of at least one comparing means at the next hierarchical level. The plurality of hierarchical levels comprises means for setting the tuneable thresholds in accordance to the output of previous hierarchical level so that non-linear distortion of the preceding hierarchical level is removed. In an embodiment the means for setting the tuneable threshold comprises variable capacitors. In an example the variable capacitors comprise first variable capacitors associated with the comparing means and second variable capacitors associated with the amplifying circuits.

Preferably the thresholds are tuned to the output of the previous level when a desired input threshold is applied, thereby cancelling non-linear distortion of the preceding hierarchical level.

In an embodiment the amplifying circuits are non-linear multiplying digital to analog converters (NLMDAC).

In an embodiment a pipelined ADC is presented wherein each of said plurality of comparing means is implemented with an amplifying circuit of said plurality of amplifying circuits in a comparator/track-and-hold amplifying circuit. Preferably such comparator/track-and-hold amplifying circuit comprises a dynamic amplifier and a latch. Each of the plurality of comparator/track-and-hold amplifying circuits generates an input signal for two comparator/track-and-hold amplifying circuits in the subsequent level.

In an embodiment the comparator/track-and-hold amplifying circuits have tunable thresholds. In an example the comparator/track-and-hold amplifying circuits comprise variable capacitors. By setting the variable capacitors, given thresholds are provided. Preferably the thresholds are tuned to the output of the previous level when a desired input threshold is applied, thereby cancelling non-linear distortion of the preceding comparator/track-and-hold amplifying circuits.

In an additional embodiment a method is provided for converting an analog input signal into a digital output using a pipelined analog-to-digital converter according to one of the foregoing embodiments. The method comprises the steps of a) applying the analog input signal to a first hierarchical level of the hierarchical tree structure, b) comparing the input signal with a respective threshold signal via a first comparing means of the first hierarchical level, thereby generating a comparison signal and feeding this comparison signal as input signal to a subsequent hierarchical level;

c) selecting a subsequent comparing means (with its associated amplifying circuit) of a second hierarchical level based on the comparison result of the previous step.

Preferably the method implements a binary search algorithm. By using a binary search instead of a parallel one, the number of active comparators is reduced and therefore the power consumption.

Based on the decision of a comparing means, an amplifying circuit in this or the succeeding level either adds or subtracts from the input signal a value depending on the weight of the decision. The comparing means of a first, parent hierarchical level controls or triggers the comparing means of a subsequent, child hierarchical level.

In an embodiment the method for converting an analog input signal into a digital output is preceded by a calibration step. The threshold of at least one comparing means is tuned during a calibration period and from that point onwards the comparator has a given threshold. The calibration step preferably comprises tuning the at least one amplifying circuit associated with the at least one of the hierarchical levels by means of a variable capacitance.

In another embodiment the step of comparing yields an output signal that is fed to a amplifying circuit/DAC, implementing a successive approximation process. A binary code is determined.

BRIEF DESCRIPTION OF THE DRAWINGS

The invention will be further elucidated by means of the following description and the appended figures.

DETAILED DESCRIPTION OF THE INVENTION

Figure 1:
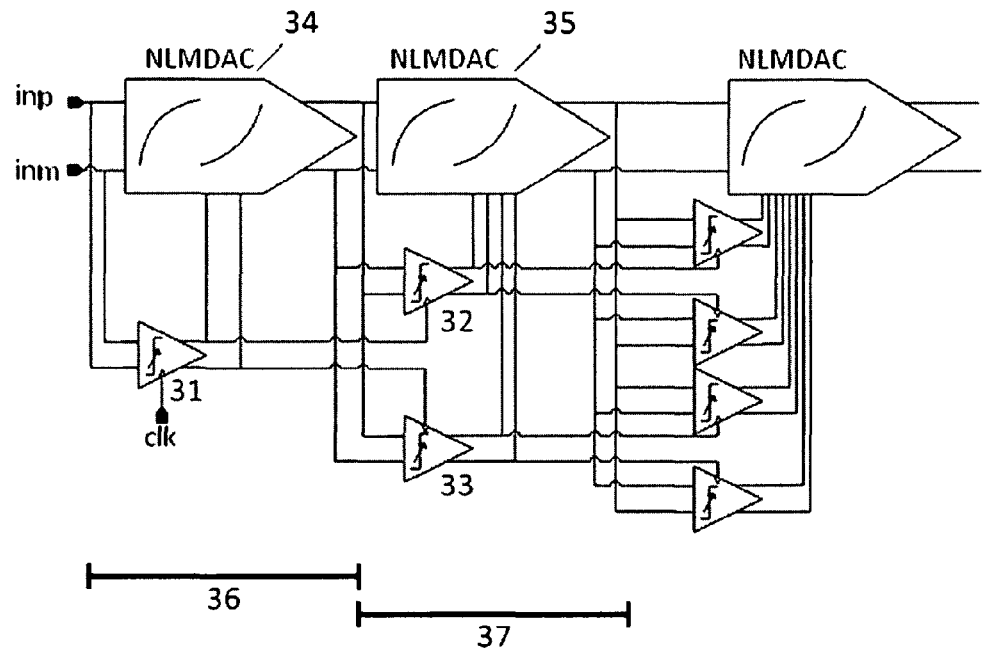
FIG. 1 illustrates a general block diagram of 3 bits of 1 bit per stage pipelined A/D converter.

The present invention will be described with respect to particular embodiments and with reference to certain drawings but the invention is not limited thereto. The drawings described are only schematic and are non-limiting. In the drawings, the size of some of the elements may be exaggerated and not drawn to scale for illustrative purposes. The dimensions and the relative dimensions do not necessarily correspond to actual reductions to practice of the invention.

Furthermore, the terms first, second, third and the like in the description, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description are used for descriptive purposes and not necessarily for describing relative positions. The terms so used are interchangeable under appropriate circumstances and the embodiments of the invention described herein can operate in other orientations than described or illustrated herein.

The term "comprising", should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present invention, the only relevant components of the device are A and B.

Conventional pipelined ADCs are based on the principle of sequential conversion. The analog signal to be converted is first sampled and compared with a threshold in a first stage comparator. The signal is then amplified by an amplification factor of 2 and the bit value of the first stage subtracted therefrom, resulting in a residue signal. This residue signal is the input signal for the second stage. Again, the residue signal is sampled and compared by a second stage comparator. This process continues in subsequent stages up to the required bit resolution.

This disclosure provides a pipelined analog-to-digital converter with non-linear signal processing (this is equivalent to residue generation and amplification) where each ADC threshold is implemented with a different calibrated comparator. This calibration can then compensate for nonlinearity as well as random offset due to device mismatch. Furthermore, only the comparators and amplifiers required for a binary search are being activated whereby low power consumption is achieved.

Preferably the pipelined converter further comprises a folding front-end.

Preferably the pipelined converter further comprises an n-bit flash analog-to-digital converter.

According to an aspect of the present disclosure, a pipelined analog-to-digital converter (PL ADC) for converting an analog input signal into a digital signal is provided as illustrated in FIG. 1. The PL ADC comprises a plurality of comparing means (31), (32), (33) having a tuneable threshold for comparing an input signal with whereby at least two of said given thresholds are different. The threshold is tuned during a calibration period and from that point each comparator has a given threshold. The PL ADC further comprises a plurality of amplifying circuits (34), (35). The plurality of comparing means is configured to form a hierarchical tree structure having a plurality of hierarchical levels (36), (37), wherein at least one of said hierarchical levels is associated with at least one amplifying circuit of the plurality of amplifying circuits. The plurality of hierarchical levels comprises means for setting the tuneable thresholds in accordance to the output (comparison result) of previous hierarchical level so that non-linear distortion of the preceding hierarchical level is removed.

Figure 2:
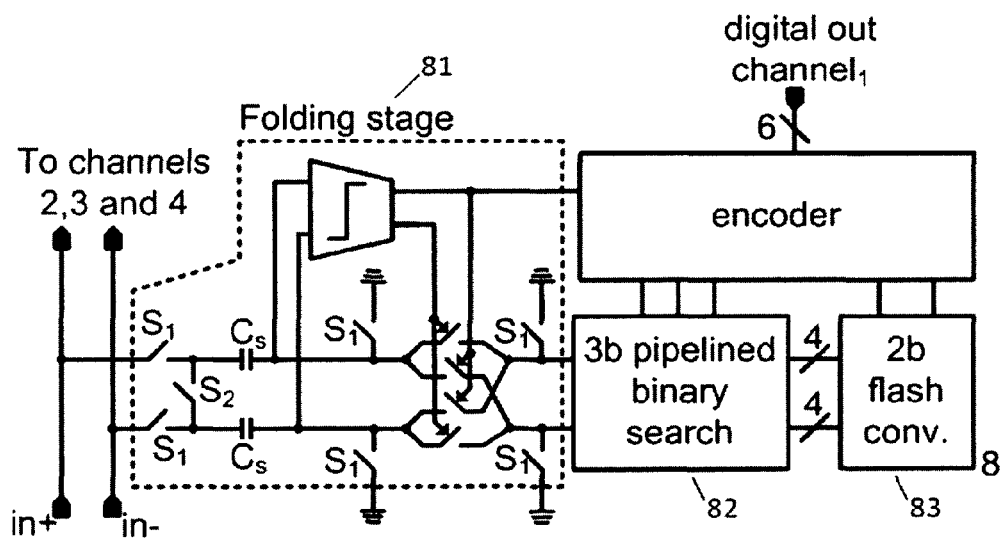
FIG. 2 illustrates an example of a hybrid ADC.
Figure 3:
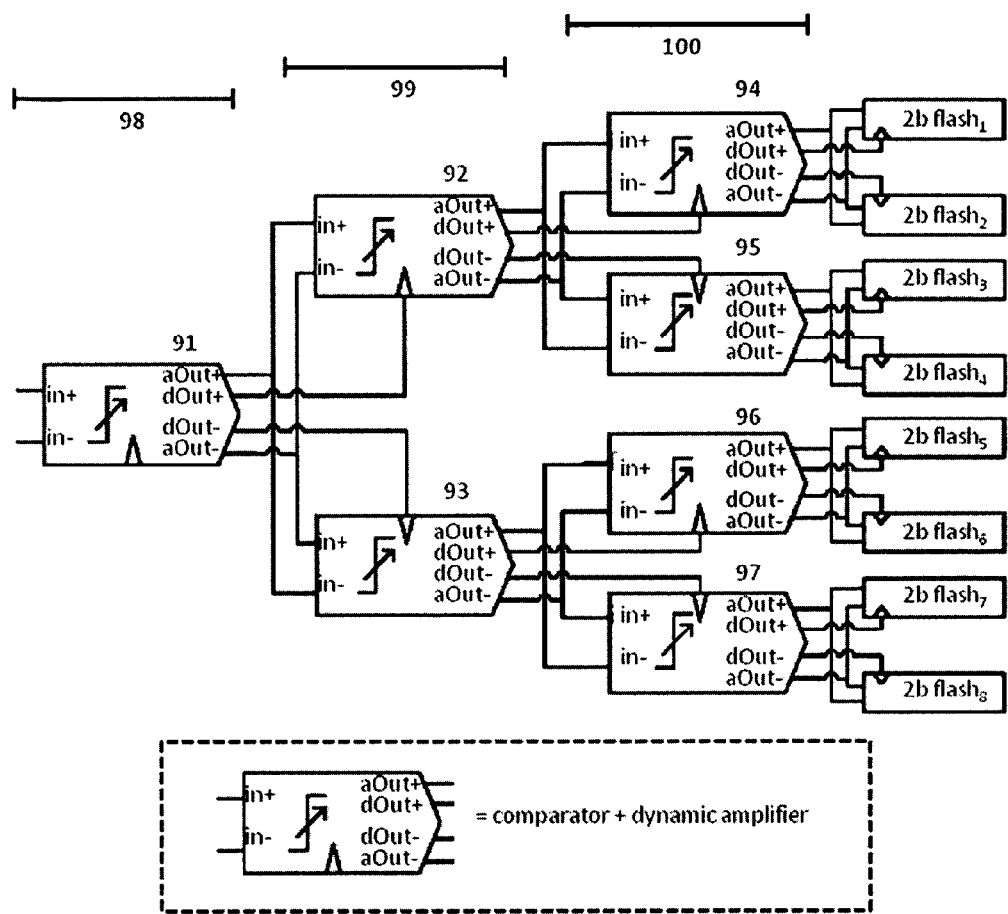
FIG. 3 illustrates a schematic of a pipelined binary search method.

In an embodiment an interleaved folding-pipeline-flash ADC (or hybrid ADC) is presented comprising an interleaved structure, this structure comprising a folding front-end, a PL ADC and a flash ADC. The architecture offers a power consumption proportional to the sampling frequency. In an example a 4× interleaved Gbit ADC is presented. Each conversion channel comprises a 1 bit folding front-end (81), 3 bits of pipelined conversion (82) and 2 bits of flash conversion (83) as illustrated in FIG. 2. The folding front-end samples the input signal, removes common-mode component of the input signal and rectifies the differential signal of the input while determining the polarity of the input signal. For the example, the PL ADC comprises seven ((91) to (97)) comparing means arranged in a hierarchical tree as illustrated in FIG. 3 comprising three hierarchical levels (98), (99), (100). In the illustrated example, each comparing means is connected to an amplifying means.

The disclosure further provides for a method for converting an analog input signal into a digital output. Preferably the method implements a binary search algorithm. By using a binary search instead of a parallel one, the number of active comparators is reduced and therefore the power consumption. At least one comparing means of a first hierarchical level is further arranged for controlling at least one other comparing means of a subsequent hierarchical level. By controlling is meant that a comparing means is arranged for selecting a path in the structure based on the comparison result of the previous step, whereby the structure is formed by the plurality of comparing means. This path is illustrated in FIG. 2. The PL ADC determines 3 bits of the conversion and generates a residue on only one of 4 outputs (output of (94), (95), (96) or (97)).

Typically, in a flash converter the bits are determined via a parallel search, requiring a lot of power consuming comparators. By using (preferably) a binary search instead of a parallel one, the number of active comparators and therefore the power consumption is reduced.

Figure 4:
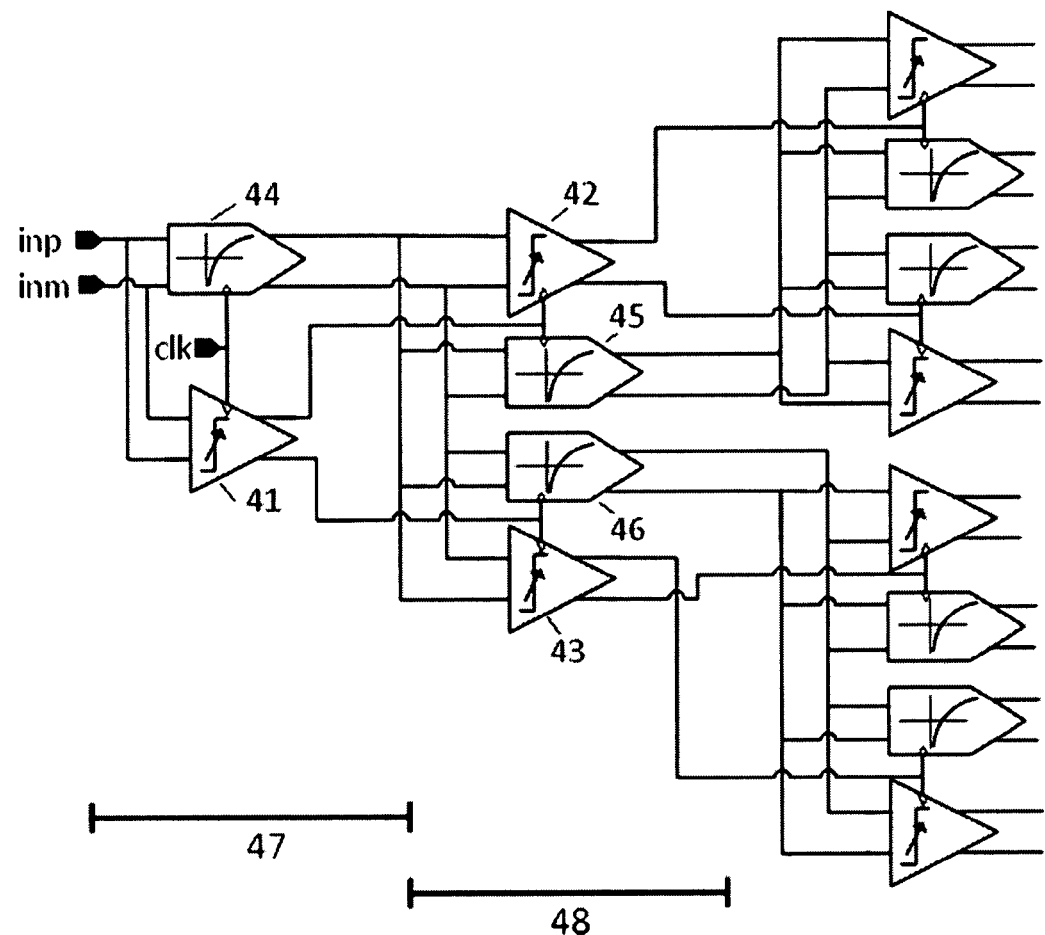
FIG. 4 shows a block diagram of 3 bits of 1 bit per stage pipelined ADC converter.

This PL ADC uses dynamic nonlinear amplifiers for low power and high speed. Linearity requirements in these amplifiers are avoided by activating a different dynamic comparator for each ADC threshold and calibrating the corresponding comparator threshold to a desired input-referred value, cancelling errors both from non-linear signal processing and offsets in the comparators. This is achieved by a tree of comparators combined with amplifying circuits each of which are calibrated individually. Threshold calibration corrects for amplifier and comparator imperfections. Each stage of the tree can be combined with one amplifying circuit (as illustrated in FIG. 1) or each comparator in a stage can be combined with an amplifying circuit (as illustrated in FIG. 4). Further, these amplifying circuits can be built-in track-and-hold amplifiers (comparator/track-and-hold amplifying in one). In a conventional pipeline the "to be converted" signal, is being sent through the chain (or cascade). There is no signal dependent routing or path selection as provided in this disclosure.

Architecture

In an example an hybrid ADC is illustrated (FIG. 2) comprising 4 interleaved analog-to-digital conversion (ADC) channels, clock generation and signal recombination. The clock generation has an $F_s$ input signal and generates from this 4 differential quadrature clock signals and 4 low-skew, low-jitter sampling signals, all with a frequency of $F_s/4$. The PL ADC can for example be used in a 60 GHz radio device. Analog-to-digital converters for such applications require sampling frequencies up to 4 GS/s. Each ADC channel consists of a 1 bit folding front end, 3 bits of pipelined binary search conversion and a 2 bit flash, for a total of 6 bit nominal conversion. The signal recombination consists of two stages of two-input multiplexers, which combine the different interleaved channel outputs into 6 full-speed bit streams. While static linearity with relaxed linearity and matching constraints is improved using threshold calibration, timing calibration is avoided due to its complexity.

Clock Generation

The clock generation generates two sets of clock signals, both of which run at a fourth of the sampling frequency. The first set of signals is a low precision differential set of quadrature signals used to control non-critical timing instances in the ADCs (in each channel) and to synchronize the different channels with respect to the others. These signals have large fan-out and hence large drive strength.

The second set of signals are the high precision sampling signals which are used to directly drive bottom plate sampling switches. The timing skew spread of these signals needs to be in the order of picoseconds, and low jitter is preferred and in some examples even required. To achieve these properties, a common inverter is used to drive the sampling signals, with the inverter output being gated to the actual sampling switches using pass gates. The pass gates are activated at suitable times, just before a falling or rising edge of the inverter output. The timing spread of the falling edges of the sampling signals is then only dependent on the on-resistance of the pass gates, and exact load presented by each sampling switch and its associated parasitics. This spread can be made very low even using moderate device sizes: a simulated standard deviation of 500 fs was obtained using 2 micrometer devices (for both NMOS and PMOS). Mismatch between sampling switch parasitics might degrade this matching in measurements. Low jitter on these signals may be achieved by maintaining a short path from clock input to sampling signal.

One Bit Folding Front-End

Figure 5:
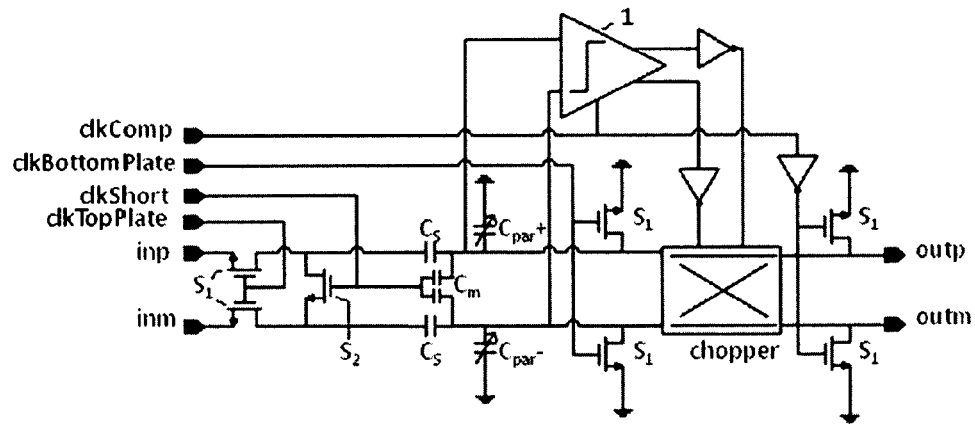
FIG. 5 shows a schematic of a folding front-end stage.

The folding front-end samples the input signal and first removes its common-mode component. The polarity of the resulting differential signal is determined by a comparator (1) and using a chopper controlled by this comparator (1) the signal is rectified to be in range of a succeeding ADC. The primary reason a folding stage is implemented in the complete converter (hybrid ADC) is to limit the calibration complexity. The schematic of the folding stage is shown in FIG. 5.

Figure 7:
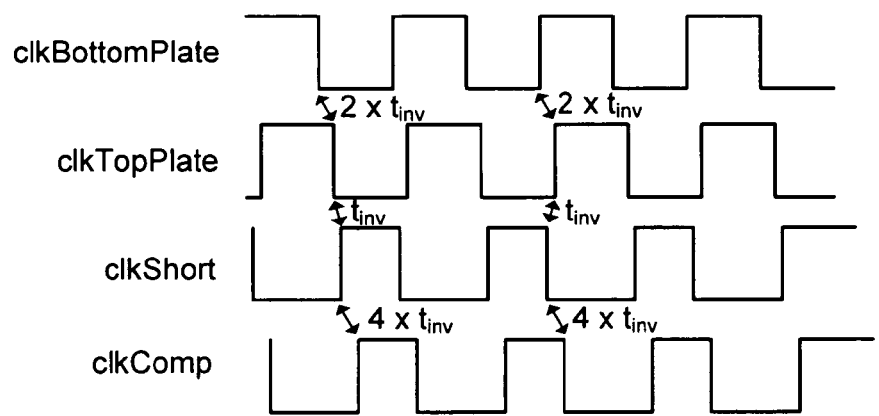
FIG. 7 shows the timing of the clock signals of a folding stage.

The timing of the different clock signals is shown in FIG. 7. When "clkBottomPlate" goes low, the switches of the bottom plate are deactivated, and the sampling capacitances $C_s$ are left mostly floating (some parasitic capacitance is present on the bottom plate). Two inverter delays ($2 \times t_{inv}$) later "clkTopPlate" also goes low and the top plate switches are disabled. An inverter delay later ($t_{inv}$), "clkShort" goes high and shorts the two top plates of sampling capacitances $C_s$. The sampled input voltage will then be transferred from the top plate to the bottom plate of $C_s$, and there generate a differential voltage.

In the absence of charge injection, the bottom plate nodes will have a common mode voltage of zero, and a differential voltage which depends on the ratio $$\frac{C_s}{C_s + C_{par}}$$

with $C_{par}$ being the total parasitic capacitance on the bottom plate nodes. To prevent one of the bottom plate nodes going below the ground potential, the common mode voltage of the bottom plates is increased by two capacitances $C_{cm}$ controlled by "clkShort".

If the parasitic capacitances of the two bottom plate nodes do not match exactly, the two voltages generated by input voltages of equal magnitude but opposite sign will not result in the same voltage on the bottom plate nodes. Regardless of what the thresholds of the succeeding ADC are, this would result in errors if a rectifying operation is performed. To ensure sufficient matching of the capacitances of the two bottom plate nodes, two banks of digitally controllable calibration capacitors are added on the bottom plate nodes.

Four inverter delays ($4 \times t_{inv}$) after the rising edge of "clkShort", the comparator is activated by a rising edge of "clkComp". An inverter delay after this rising edge, the switches clamping nodes outm and outp to ground are turned off. The comparator's decision asynchronously activates one of two sets of chopper switches, which share the voltage on the bottom plates of $C_s$ to the output nodes, and complete the folding front-end's operation.

The $C_{par}$ capacitors are calibrated based on the following procedure. The first threshold of the next stage is calibrated in the positive and negative half of the ADC range. These two values are compared, and the mean is assumed "correct" and set. Then based on this threshold, the $C_{par}$ values can be adapted.

Figure 6:
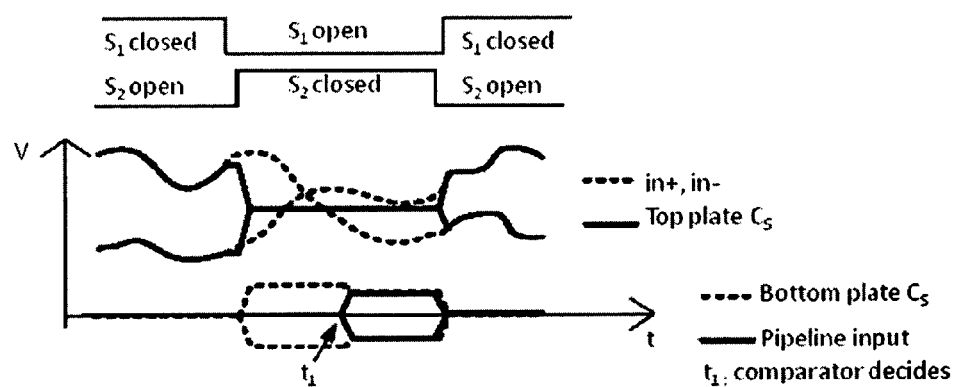
FIG. 6 the waveforms of a folding front-end stage.

FIG. 5 shows a simplified schematic of the folding front-end and FIG. 6 its waveforms. It samples and rectifies the input signal while removing its common-mode. When the $S_1$ switches are closed the input voltages are tracked across $C_s$. At a falling $\phi_1$ edge the charges on $C_s$ are fixed. Their bottom plates are at ground and the top plates at their sampled input voltage, neglecting charge injection. Closing $S_2$ shorts the top plates and generates the differential voltage at the bottom plates with some loss due to stray capacitance. The folding stage comparator is then activated, and based on its decision closes one set of switches in the chopper (at $t_1$), sharing the charge on the bottom plates with the next stage such that the differential output voltage is always positive. The common-mode output is independent of the common-mode input which fixes the common-mode voltage for the ADC back-end and significantly improves the common-mode input range. Moreover, the applied common-mode voltage may differ in calibration and normal operation.

Pipelined Binary Search
General Principle

In general terms a pipelined binary search (PLBS) converter consists of a cascade of non-linear multiplying digital to analog converters (NLMDACs) and a tree of comparators, as shown in FIG. 1 for 3 bits of 1 bit per stage PLBS. The NLMDAC's purpose is to sample its input signal, to amplify it and to subtract/add some value from the output to bring it closer to zero. In a traditional pipelined converter, the linearity requirement on the first stage MDAC is equal to the overall desired linearity. In this disclosure significant nonlinearity is allowed by using a different comparator with tunable threshold for each PL ADC threshold. During a start-up or background calibration, the comparator threshold can be tuned so it cancels the nonlinear effects of the cascade of preceding NLMDACs for the desired ADC threshold. Since the only requirement on the NLMDAC is that it is monotonic, power savings are possible.

Implementation

The input of the PL ADC using a binary search is the output of the folding front-end. The approach chosen here modifies the general PLBS principle as shown in FIG. 3. There are three key differences between the chosen implementation and the general principle.

First, the subtraction function of each NLMDAC is moved from the current stage NLMDAC to the next stage NLMDAC. Shifting the subtraction to the next stage increases the voltage swing on the NLMDAC output nodes, but given the low voltage swing and linearity requirement of the NLMDACs this is not a problem.

Second, the NLMDACs can be split up in second and later stages so that each of them is loaded by two comparators and two split NLMDACs. If they are made dynamic and only clocked when needed, there is no power penalty associated in doing so, while the load of each NLMDAC is kept constant throughout the pipeline. The subtraction function from the previous stage can then be hardwired into these NLMDACs. The previous stage comparator decision determines which of them is activated. Note that in FIG. 3, the inputs and outputs of the two identical NLMDACs of stage 2 are connected with switched polarity, so if one subtracts a voltage from its input, the other adds the same value.

Third, this converter's input range is not symmetrical around 0 V differential. Because the input signal is rectified in the previous stage (folding front end stage), only positive differential signals should be converted. By subtracting half of the input range from the input signal of the first stage, the succeeding stages can be made roughly differential around 0.

Circuit Blocks

As can be seen in FIG. 4, each NLMDAC (44) in the chosen implementation is in parallel with a comparator with tunable threshold. As such these were merged into a single structure called a comparator/track-and-hold amplifier (CTHA). All CTHAs except those in the penultimate stage then have a load of two CTHAs, with the convention that the CTHA in the earlier stage is called "parent" and the CTHAs in the later stage are called "child". The CTHAs in the penultimate stage are loaded simply by two comparators each in the last stage.

Figure 8:
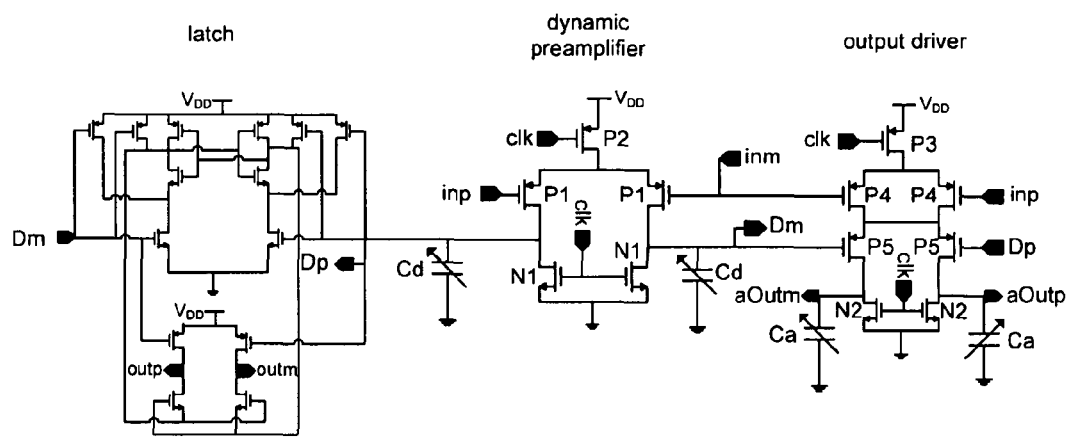
FIG. 8 shows an example of a possible comparator-T/H circuit.

The schematic of the comparator/track-and-hold amplifier (CTHA) is shown in FIG. 8, NMOS reset switches on the sources of P1, P4 and P5 have been omitted for clarity. The circuit consists of three parts: a dynamic preamplifier, a latch and an output driver. The dynamic preamplifier and latch combine a comparator.

The dynamic preamplifier and output driver combine to form a track and hold amplifier. When the clock signal goes low, transistor pairs N1 and N2 turn off, while P2 and P3 turn on. The nodes Dm and Dp are pulled from ground up to Vdd at a rate depending on the input voltage. During this charging phase transistors P5 are on and charge the nodes aOutp and aOutm. When the voltages on Dp and Dm are high enough, the P5 pair is turned off, and no more current flows in the circuit, so that the voltage on aOutp and aOutm is fixed by the amount of charge added to these nodes.

The input voltage is thus converted into a time (the time the P5 pair is on) and then back into voltage (the charge added to the output capacitors). Since the output voltage depends on the input voltage, a track and hold function is achieved.

Transistors P4 achieve common mode (CM) stabilization: if CM level goes down, P5 is active for a shorter time, but the current they draw from the output capacitor increases due to increased overdrive of P4. Variable capacitance is added to both gate and drain nodes of P5 to control the threshold and gain of the CTHA through PVT (process, voltage, temperature) variations and to cope with the inherent nonlinearity of the input-output characteristic by individually changing this input-output characteristic to best suit the succeeding stages.

If this CTHA is made balanced differentially, and no mismatch is present, the comparator threshold is zero and the input output relation is given by out≈in×gain, with the gain being determined by the transistor sizes and the chosen values of Cd and Ca. If the dynamic preamplifier circuit is imbalanced in some way, the comparator threshold will change to a value $V_{offset}$ while the input output relationship changes to out≈(in−$V_{offset}$)×gain. In other words: the output is roughly zero when the comparator is at its threshold (note that the comparator is formed by combining the latch and the dynamic preamplifier).

This property is extremely convenient for the chosen implementation. If the PLBS converter is supposed to have an input range from 0 to $V_{IR}$ the first comparator should have a threshold of $V_{IR}/2$ and the first MDAC should subtract $V_{IR}/2$ from the input, both of which can be elegantly achieved by using a CTHA with intentional imbalance in the widths of the P1 pair. If the gain is chosen equal to 2, the next PLBS stage should process voltages between −$V_{IR}$ and +$V_{IR}$. Since the next stage has two CTHAs with swapped differential inputs, each CTHA should process a signal between 0 and $V_{IR}$, so that all CTHAs in the tree can share the same imbalance.

In practice all the levels of the CTHA tree require calibration so the comparator thresholds correctly cancel the nonlinearity of the preceding amplifiers. The Cd capacitors are changed first to set the parent threshold (thereby calibrating comparator threshold of highest hierarchical level). As in FIG. 4, the parent threshold is the threshold of the CTHA (41), (44) of the first level. Then the Ca capacitors are used for coarse threshold tuning for both child CTHAs. A first child CTHA is illustrated in FIG. 4 and is a combination of (42) and (45), a second child CTHA is a combination of (43) and (46). The Ca capacitors are used to set the amplifier output close to the uncalibrated comparator thresholds of the next level when their corresponding ADC thresholds are applied.

Figure 9:
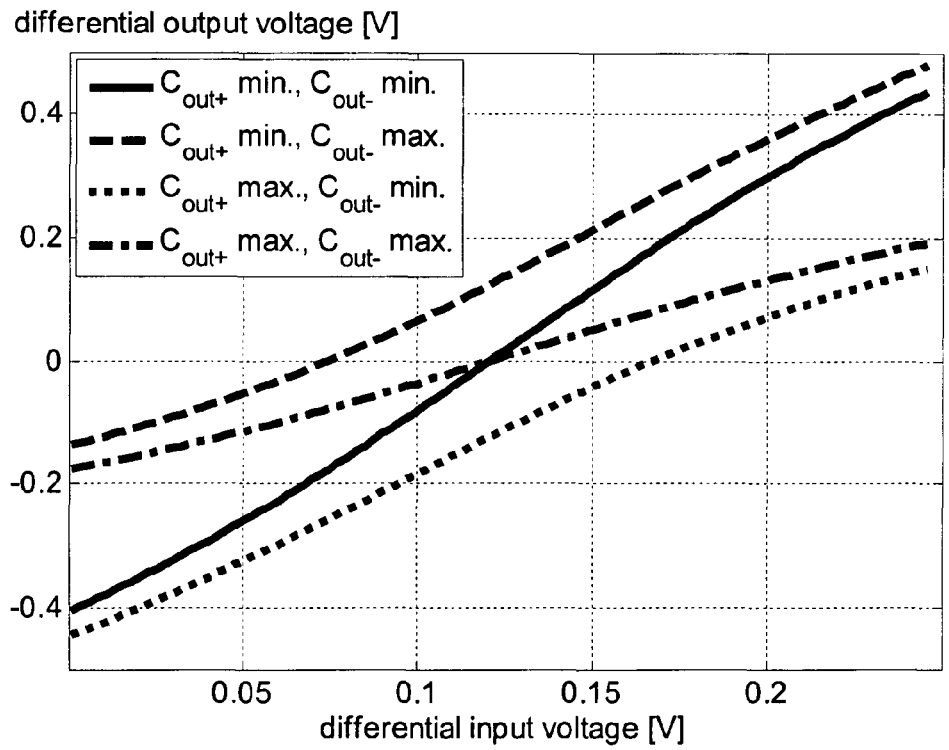
FIG. 9 shows a plot of a simulated input-output characteristic of the dynamic amplifier.

FIG. 9 shows the simulated input-output characteristic for maximum and minimum values of the Ca capacitances. At high input voltages the output voltage is much more sensitive to Ca at node aOutp (or $C_{out+}$) than to Ca at node aOutm (or $C_{out+}$) (see FIG. 8), whereas the inverse is true at low input voltages. This matches intuition: when the positive output voltage is high, a lot of charge has been dumped into this node and a change in its capacitance value leads to high voltage change. This input-dependent sensitivity is exploited in the proposed calibration procedure.

Figure 10:
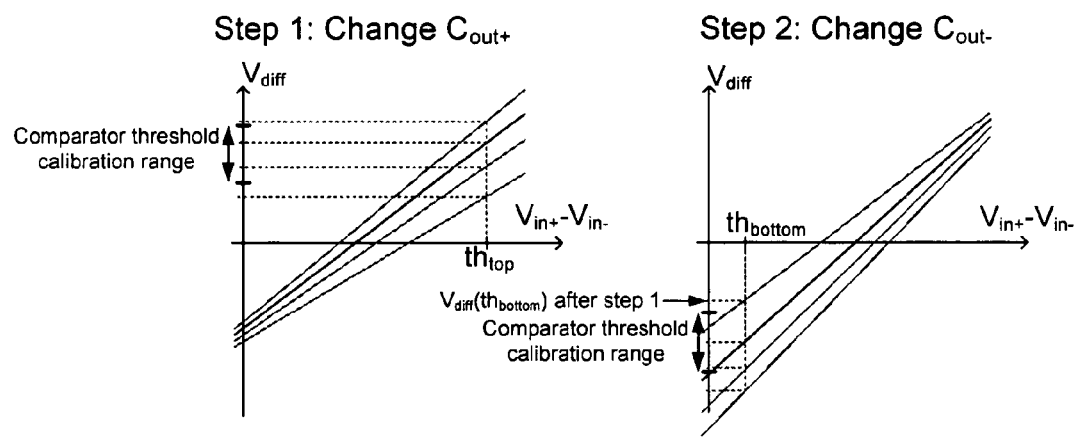
FIG. 10 shows plots of different calibration steps, for calibrating Ca.

The proposed calibration procedure for a CTHA is the following:
1. Apply the parent CTHA desired ADC threshold and observe the ADC output
2. Change Cd capacitors, shifting the parent CTHA threshold until the CTHA decisions match as closely as possible 50% positive and 50% negative.
3. Apply the desired ADC threshold of the first (highest voltage) child CTHA and observe the ADC output
4. Change capacitor Ca on aOutp (or $C_{out+}$) of the parent CTHA such that the threshold of the first child CTHA is between the parent CTHA outputs for consecutive settings for this Ca.
5. Apply the desired ADC threshold of the second child CTHA and observe the ADC output
6. Change capacitor Ca on aOutm (or $C_{out-}$) of the parent CTHA such that the threshold of the second child CTHA is between the parent CTHA outputs for consecutive settings for this Ca.
7. Repeat from step 1 for both child CTHA The results of the calibration process are illustrated in FIG. 10. In the first step, the top threshold ($th_{top}$) of the next stage is applied, and Ca at node aOutp is changed to bring the amplifier output in the calibration range of the comparator which implements this threshold. Next, the bottom threshold ($th_{bottom}$) of the next stage is applied and Ca at node aOutm is similarly changed. The next PLBS stage can then be calibrated using the same process: calibrating the comparator threshold first and the Ca capacitances next. This assumes that Sensitivity of the analog output voltage with respect to the Ca capacitor value on the aOutm pin is low when the output voltage is positive (so that no iteration is required).

Calibration steps of Ca capacitors are smaller than the threshold range possible by calibration of the child Cd capacitances.

It is important to note that the "common mode" Cd capacitance changes the gain of a row, so redoing a row with different common mode capacitance if a next row cannot be calibrated, might be needed.

Clocking

Figure 11:
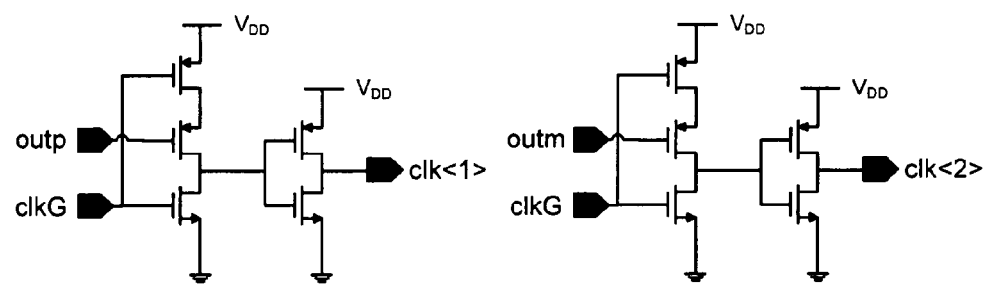
FIG. 11 shows schematics for circuits used to gate clock for each row.

The clocking of each child CTHA is done using the circuits in FIG. 11. If the parent CTHA has regenerated properly, either outm or outp nodes will have discharged to ground. When clkG goes low, the internal node is pulled up to Vdd and the appropriate clock signal goes low (either outm or outp). When the clkG signal goes high, all the clock signals (outm and outp) are pulled high and CTHAs on the next row are reset.

Figure 12:
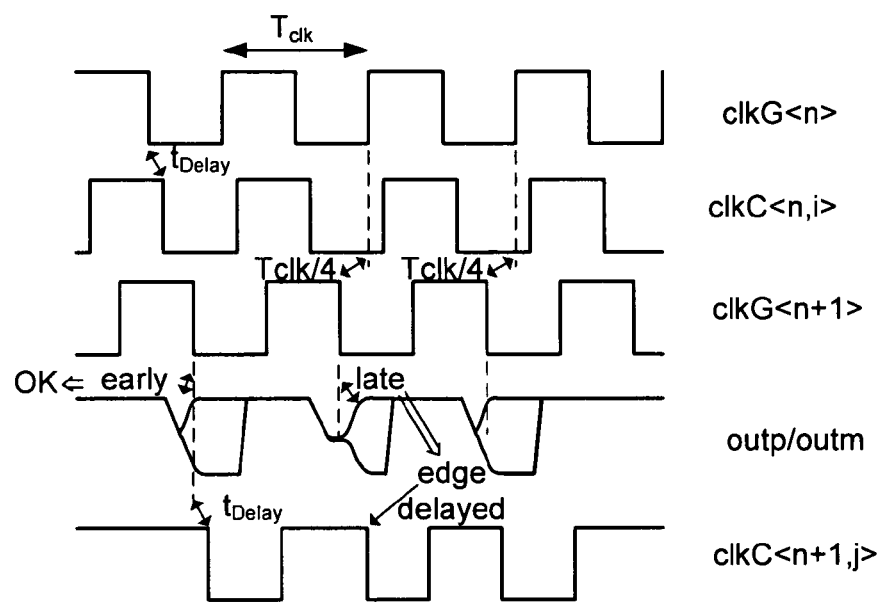
FIG. 12 shows the timing of different clock signals in the Comparator/Track&Hold Amplifier tree.

An example of the timing of the different clock signals is shown in FIG. 12. In this clkG<n> is a global clock shared by all CTHAs in the $n^{th}$ row. The signal clkG<n+1> is always $T_{clk}/4$ delayed with respect to clkG<n>. Consequently, to ensure that each comparator has equal regeneration time, a comparator must decide in $T_{clk}/4-t_{Delay}$. In the graph shown the center regeneration is slow. Consequently, the decision time for the next comparator is smaller. However this comparator will have a larger input signal, and therefore decide faster.

In general, for the PLBS tree to work properly, each comparator must decide in $T_{clk}/2-t_{Delay}-t_{Aperture}$, any two consecutive comparators must decide in $3 \cdot T_{clk}/4-2 \cdot t_{Delay}-t_{Aperture}$, any three consecutive comparators must decide in $T_{clk}-3 \cdot t_{Delay}-t_{Aperture}$, and so on. In this $t_{Delay}$ is the gate delay from the circuits in FIG. 11 and $t_{Aperture}$ is the aperture time of the next CTHA.

Only two clkG signals are distributed over the width of the converter, and inverted where necessary. These are the lower precision, high drive strength signals generated in the clock generation described before.

Encoder

The encoder (84) converts the comparator decisions into 3 bit gray code. It consists of precharge/discharge ROM lines controlled by the clkC outputs on each row. If metastability occurs in one of the rows, all bits starting from this row will be 0.

Flash Converter

The flash converter (83) converts the output of 3 stages of PLBS conversion, which will by construction add nonlinear distortion. To cope with this nonlinear distortion we need 8 different flash converters, with reconfigurable thresholds. Each CTHA in the last layer of the PLBS tree is then loaded by two identical flash converters, with their inputs reversed. Which of these two flash converters is activated then depends on the decision of the comparator. During a calibration phase, each flash converters thresholds is adapted or adjusted so it cancels the nonlinearity and mismatch of the preceding CTHA stages.

The invention claimed is:
1. A pipelined analog-to-digital converter, comprising:
   a plurality of comparing means, wherein said comparing means comprise:
   a) a hierarchical tree structure, wherein said hierarchical tree structure comprises a plurality of hierarchical levels; and
   b) tuneable thresholds, wherein said tuneable thresholds are configured to be settable; and
   a plurality of amplifying circuits;
   wherein said comparing means are configured to compare an input signal and at least two of said tuneable thresholds, wherein at least one of said hierarchical levels is associated with at least one amplifying circuit from said plurality of amplifying circuits, wherein said at least one amplifying circuit is configured to generate said input signal of at least one comparing means at a next hierarchical level, wherein said plurality of hierarchical levels comprises a means for setting said tuneable thresholds based on an output of a previous hierarchical level in an effort to remove nonlinear distortion of said previous hierarchical level.

2. The pipelined analog-to-digital converter of claim 1, wherein said means for setting said tuneable thresholds comprises variable capacitors.

3. The pipelined analog-to-digital converter of claim 2, wherein said variable capacitors comprise first variable capacitors associated with said comparing means and second variable capacitors associated with said amplifying circuits.

4. The pipelined analog-to-digital converter of claim 1, further comprising a clock, wherein said clock is configured to operate at a sampling frequency.

5. The pipelined analog-to-digital converter of claim 1, wherein each of said comparing means comprises a latch and a dynamic preamplifier.

6. The pipelined analog-to-digital converter of claim 1, wherein said amplifying circuits comprise non-linear digital-to-analog converters.

7. The pipelined analog-to-digital converter of claim 1, wherein each amplifying circuit of said plurality of amplifying circuits comprises a comparator/track-and-hold amplifying circuit.

8. The pipelined analog-to-digital converter of claim 1, further comprising an encoder, wherein said encoder is configured to convert an outcome from said comparator/track-and-hold amplifying circuit into a 3 bit gray code.

9. The pipelined analog-to-digital converter of claim 1, further comprising an m-bit folding analog-to-digital converter front-end.

10. The pipelined analog-to-digital converter of claim 1, further comprising an n-bit flash analog-to-digital converter.

11. A method, comprising:
calibrating a pipelined analog-to-digital converter, wherein said pipelined analog-to-digital converter comprises:
i) a plurality of comparing means, wherein said plurality of comparing means comprise tuneable thresholds, wherein said tuneable thresholds are configured to be compared to an analog input signal, wherein at least two of said tuneable thresholds are different; and
ii) a plurality of amplifying circuits, wherein said plurality of comparing means comprises a hierarchical tree structure, wherein said hierarchical tree structure comprises a plurality of hierarchical levels, wherein at least one of said hierarchical levels is associated with at least one amplifying circuit of said plurality of amplifying circuits, wherein said at least one amplifying circuit is configured to generate an analog input signal for at least one comparing means at a next hierarchical level, wherein said calibrating comprises tuning said at least one amplifying circuit associated with at least one of said hierarchical levels by means of a variable capacitance;
applying a first analog input signal to a first hierarchical level of said hierarchical tree structure;
comparing said first analog input signal with a respective threshold signal via a first comparing means of said first hierarchical level;
generating a comparison signal, wherein said comparison signal is configured to be a second analog input signal of at least one comparing means at a second hierarchical level;
selecting a comparing means and an associated amplifying circuit of said second hierarchical level based on said comparison signal.

12. The method of claim 11, wherein said variable capacitance comprise first variable capacitors associated with said comparing means and second variable capacitors associated with said amplifying circuits.

13. The method of claim 11, wherein said pipelined analog-to-digital converter further comprises a clock, wherein said clock is configured to operate at a sampling frequency.

14. The method of claim 11, wherein said amplifying circuits comprise non-linear digital-to-analog converters.

15. The method of claim 11, wherein each amplifying circuit of said plurality of amplifying circuits comprises a comparator/track-and-hold amplifying circuit.

16. The method of claim 11, wherein said pipelined analog-to-digital converter further comprises an encoder, wherein said encoder is configured to convert an outcome of said comparator/track-and-hold amplifying circuit into a 3 bit gray code.

17. The method of claim 11, wherein each of said comparing means comprises a latch and a dynamic preamplifier.

18. The method of claim 11, wherein calibrating said pipelined analog-to-digital converter further comprises adjusting at least one said variable capacitance based on a set of outcomes of said comparator/track-and-hold amplifying circuit, wherein said set of outcomes substantially comprise 50% positive values and 50% negative values.

19. The method of claim 11, wherein calibrating said pipelined analog-to-digital converter further comprises calibrating each hierarchical level of said pipelined analog-to-digital converter.

20. The method of claim 11, wherein said pipelined analog-to-digital converter further comprises an m-bit folding analog-to-digital converter front-end.

21. The method of claim 11, wherein said pipelined analog-to-digital converter further comprises an n-bit flash analog-to-digital converter.

* * * * *

UNITED STATES PATENT AND TRADEMARK OFFICE
CERTIFICATE OF CORRECTION

PATENT NO.        : 8,618,973 B2
APPLICATION NO. : 13/382735
DATED             : December 31, 2013
INVENTOR(S)       : Bob Verbruggen Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 163 days.

Signed and Sealed this
Twenty-second Day of September, 2015

Michelle K. Lee
*Director of the United States Patent and Trademark Office*